United States Patent [19]

Gerber

[11] Patent Number: 5,789,941
[45] Date of Patent: Aug. 4, 1998

[54] ECL LEVEL/CMOS LEVEL LOGIC SIGNAL INTERFACING DEVICE

[75] Inventor: Rémi Gerber, Nantes, France

[73] Assignee: Matra MHS, Nantes, France

[21] Appl. No.: 750,203

[22] PCT Filed: Mar. 28, 1995

[86] PCT No.: PCT/FR96/00469

§ 371 Date: Feb. 19, 1997

§ 102(e) Date: Feb. 19, 1997

[87] PCT Pub. No.: WO96/31006

PCT Pub. Date: Oct. 3, 1996

[30] Foreign Application Priority Data

Mar. 29, 1995 [FR] France ................ 95 03713

[51] Int. Cl.[6] ............................... H03K 19/0185
[52] U.S. Cl. .................... 326/73; 326/34; 326/83
[58] Field of Search ................ 326/34, 68, 73, 326/74, 83, 115

[56] References Cited

U.S. PATENT DOCUMENTS

| | | |
|---|---|---|
| 4,968,904 | 11/1990 | Yamashita et al. ............ 326/83 |
| 5,105,107 | 4/1992 | Wilcox ............................ 326/83 |
| 5,517,148 | 5/1996 | Yin ................................. 326/68 |

*Primary Examiner*—Edward P. Westin
*Assistant Examiner*—Don Le
*Attorney, Agent, or Firm*—Larson & Taylor

[57] ABSTRACT

An ECL level/CMOS level logic signal interfacing device includes, connected in cascade, a circuit for generating an in-phase relationship with an ECL level input signal, a threshold inverter circuit receiving the in-phase signal at an inverter input and delivering an inverted in-phase signal, a shaping inverter circuit receiving the inverted in-phase signal and outputting a calibrated in-phase signal, and an output amplifier circuit receiving the calibrated in-phase signal and outputting an output signal to the CMOS level in phase relationship with the ECL level input signal. The circuits are supplied with a CMOS level supply voltage relative to a reference voltage.

10 Claims, 4 Drawing Sheets

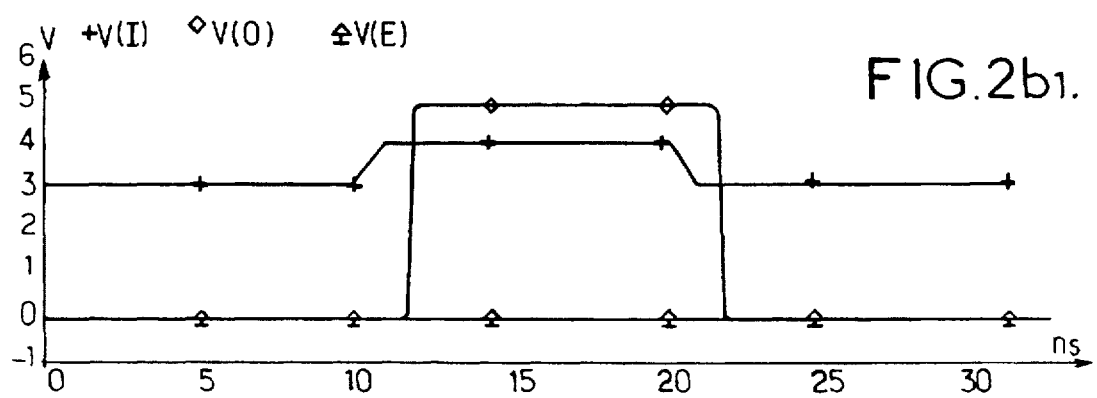
FIG.2b1.
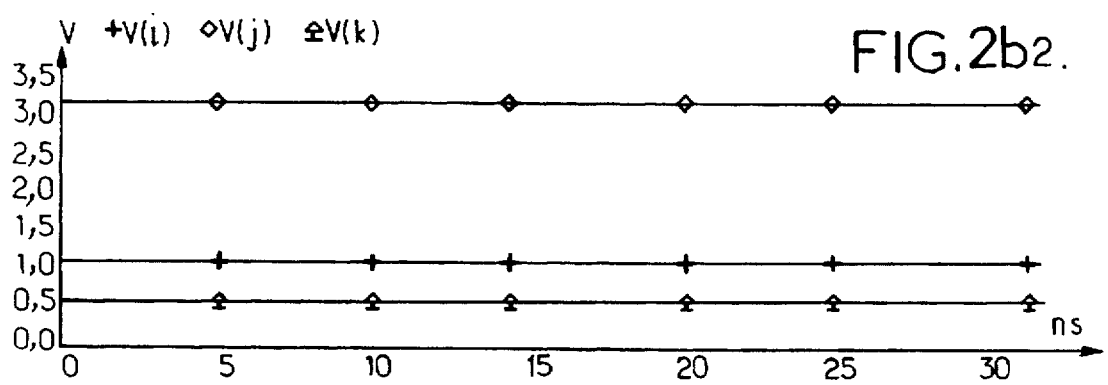
FIG.2b2.
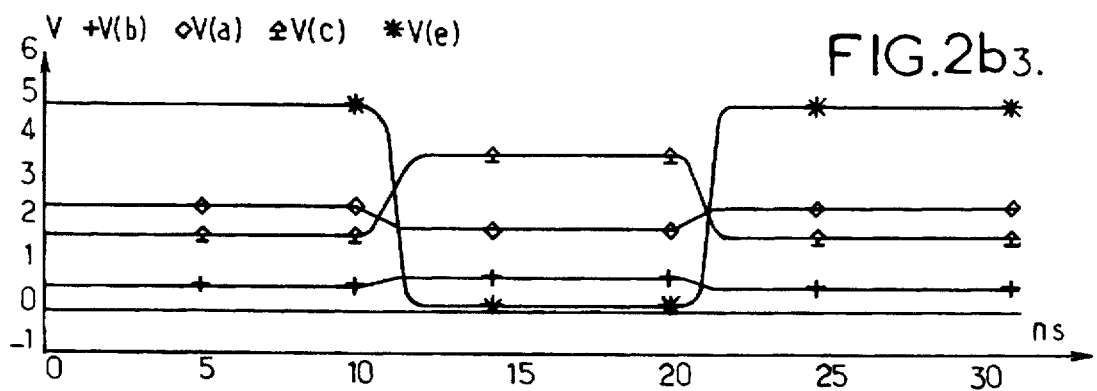
FIG.2b3.
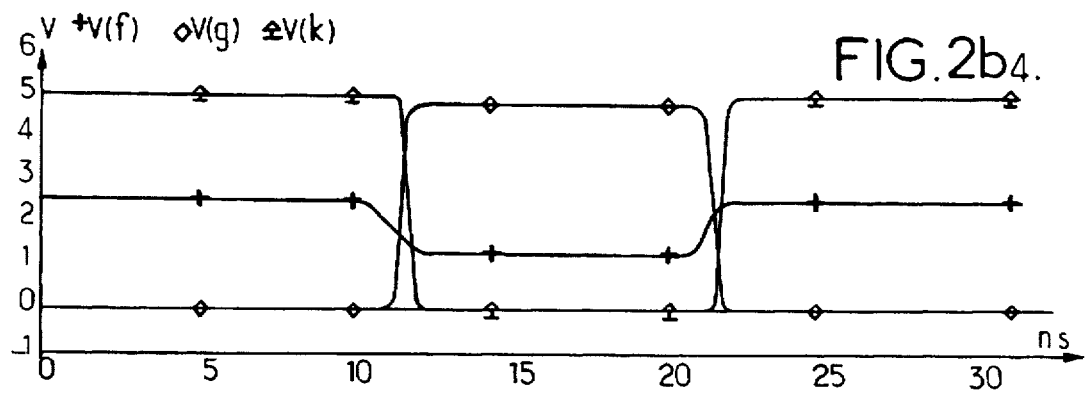
FIG.2b4.

ECL LEVEL/CMOS LEVEL LOGIC SIGNAL INTERFACING DEVICE

The invention relates to an ECL level/CMOS level logic-signal interfacing device.

In current integrated circuits, especially logic circuits, it is essential to allow switching from a low logic level to a high logic level, or vice versa, within a small switching amplitude range.

In particular in so-called ECL (Emitter Coupled Logic) structures, the switching between low and high logic levels is defined between 3.2 V (low level) and 4.1 V (high level).

However, this type of circuit, which is being used more and more, poses the problem of the compatibility of these logic levels with the logic levels of the CMOS integrated circuits for which the low logic level is less than 1 V and the high logic level substantially equal to 5 V. The compatibility problem posed relates not only to the values of the supply voltages for these circuits but also to the continuity of transmission of the logic information because, especially, of the risk of ambiguity caused by the lack of discrimination between the ECL logic levels and the CMOS logic levels.

Various solutions have been proposed in a similar context relating to the lack of compatibility between BTL logic levels, low-voltage logic circuits, 1.1 V low logic level, 1.9 V high logic level and TTL (Transistor Transistor Logic) or CMOS. One envisaged solution within the aforementioned context may consist in generating a common threshold voltage, intermediate between the TTL and CMOS high logic level and low logic level, and in discriminating these logic levels from this threshold value.

This solution is satisfactory, but it has, however, the following drawbacks:

presence of an added structure which can be used to generate the common threshold voltage and to discriminate between the aforementioned logic levels;

occupation of a large area in the case of integrating this added structure in the form of an integrated circuit and corresponding occupation of silicon. Transposing such a solution to ECL logic circuits is therefore not to be desired because of the persistence of the aforementioned drawbacks.

The object of the present invention is to remedy these drawbacks by virtue of the use of an ECL/CMOS level logic-signal interfacing device in which the use of any common threshold voltage and of discrimination from this threshold voltage is dispensed with.

Another object of the present invention is also the use of an ECL/CMOS level logic-signal interfacing device in which the continuity of transmission of the logic information is provided by the use of transitions between voltage values of the low and high logic levels having compatible and gradually changing amplitudes.

The ECL level/CMOS level logic-signal interfacing device, the subject of the present invention, is noteworthy in that it comprises, connected in cascade and supplied with a CMOS level supply voltage relative to a reference voltage, a circuit for generating a signal in phase with the ECL level input signal, this in-phase signal having an amplitude greater than that of the input signal and a mean amplitude value greater than that of the ECL level input signal, a threshold inverter circuit, the threshold value of which is substantially equal to the mean amplitude value of the in-phase signal, this inverter circuit receiving on an inverting input the in-phase signal and delivering an inverted signal, a shaping inverter circuit receiving the inverted in-phase signal and delivering a calibrated in-phase signal and an output amplifier circuit receiving the calibrated in-phase signal and delivering an output signal, at the CMOS level, in phase with the input signal.

Such a device finds application in the manufacture of integrated circuits or of components for integrated circuits.

It will be more clearly understood on reading the description and on examining the drawings appended hereto, in which.

Figure 1:
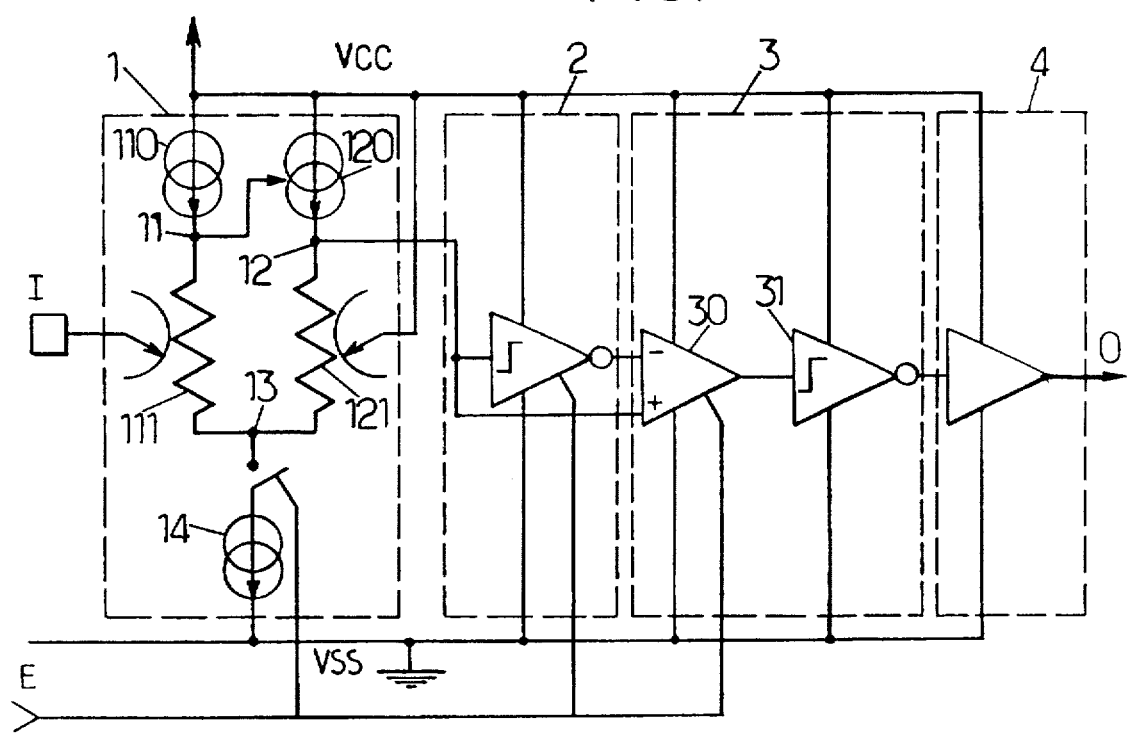
FIG. 1 represents a functional schematic diagram of the device which is the subject of the present invention.
Figure 2A:
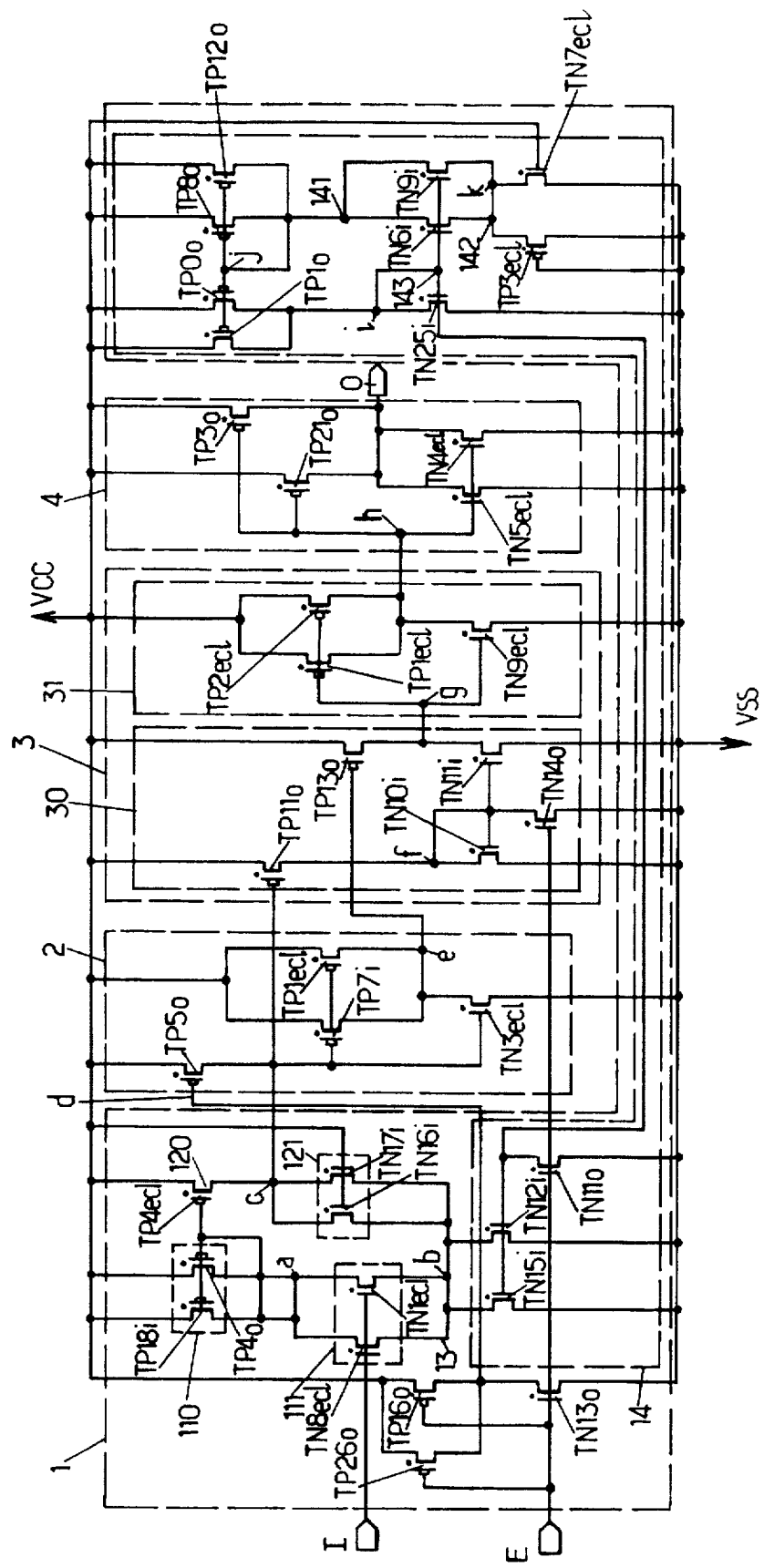
FIG. 2a represents, by way of nonlimiting example, a diagram of one embodiment of the device which is the subject of the invention, according to FIG. 1, in CMOS technology.
Figure 3:
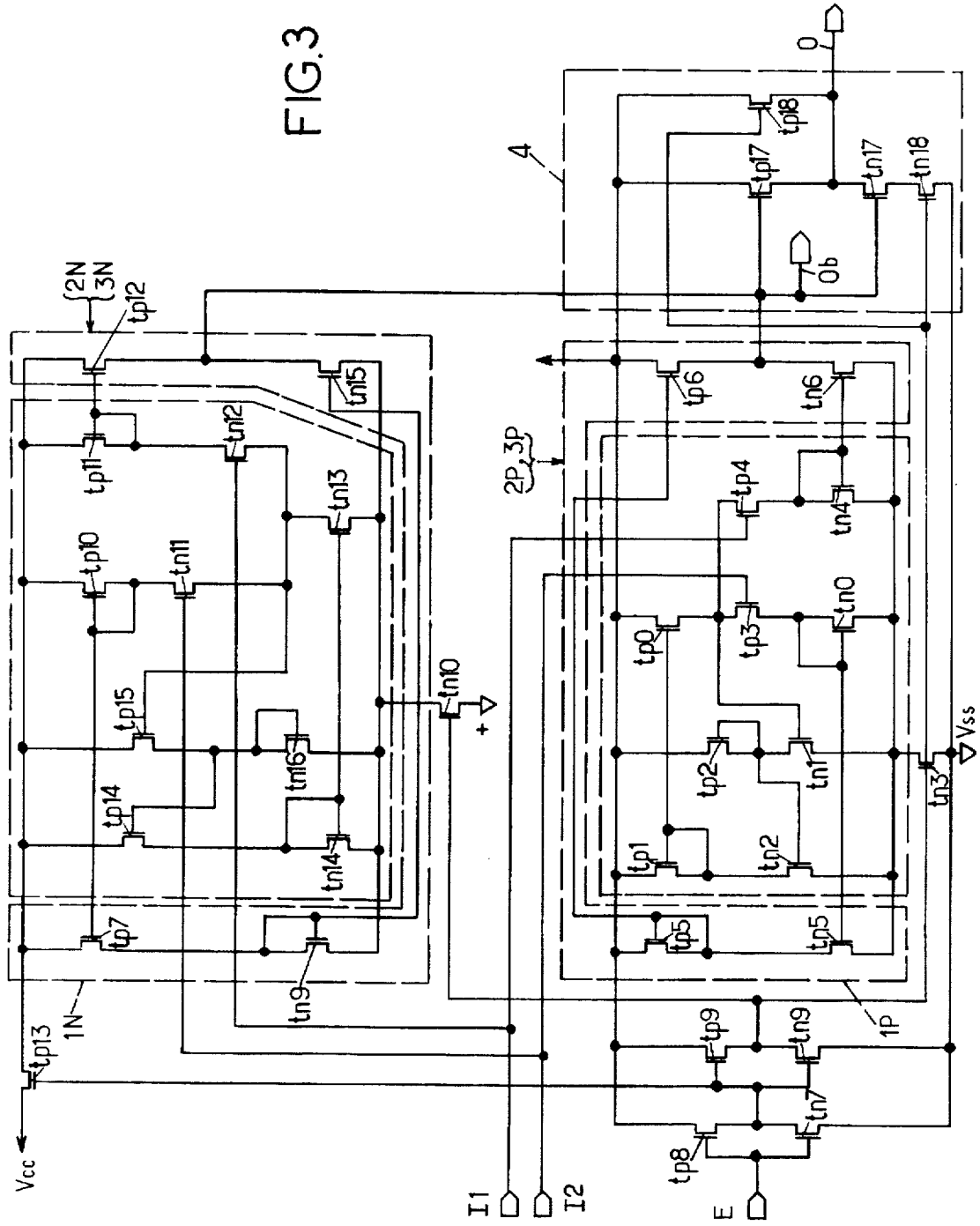

FIGS. 2b1 to 2b4 represent signal timing diagrams obtained at the test points in FIG. 2a;

FIG. 3 represents a diagram of a particular embodiment of the device which is the subject of the invention, in which a differential mode of inputing two ECL signals is used.

A more detailed description of the ECL level/CMOS level logic-signal interfacing device, which is the subject of the present invention, will now be given in conjunction with FIG. 1.

The device, which is the subject of the invention, shown in FIG. 1 is normally supplied with a CMOS level supply voltage, denoted by VCC, relative to a reference voltage VSS.

It is composed of a series of modules connected in cascade, these modules consisting, in succession, of a circuit 1 for generating a signal in phase with the ECL level input signal, this input signal being denoted I. In accordance with one particularly advantageous characteristic of the device which is the subject of the present invention, the in-phase signal has an amplitude greater than that of the input signal I and a mean amplitude value greater than that of this same ECL level input signal.

A threshold inverter circuit 2 is provided in which the in-phase signal delivered by the circuit 1 is received on an inverting input, this threshold inverter circuit 2 having a switching threshold, the threshold value of which is substantially equal to the aforementioned mean amplitude value of the in-phase signal. The threshold inverter circuit 2 delivers an inverted in-phase signal.

A shaping inverter circuit 3 is provided, this shaping inverter circuit 3 being connected to the threshold inverter circuit 2 so as to receive the inverted in-phase signal delivered by the latter. It delivers a calibrated in-phase signal.

Finally, an output amplifier circuit 4 is provided, this circuit being connected to the shaping inverter circuit 3, this output amplifier circuit receiving the calibrated in-phase signal delivered by the latter and delivering an output signal, denoted by O, to the CMOS level, this signal being substantially in phase with the input signal I.

Thus, as furthermore shown in FIG. 1 and particularly advantageously, the circuit 1 for generating an in-phase signal, the threshold inverter circuit 2 and the shaping circuit 3 may include a control circuit receiving a control signal E making it possible to reduce the steady-state electric-power consumption, in standby mode, of the interfacing device which is the subject of the present invention. According to an advantageous additional characteristic, it may be pointed out that the aforementioned control circuit which can be used to apply, onto the output of the amplifier circuit 4, a CMOS level output signal making it possible to inhibit the steady-state consumption of any downstream circuit connected to this output and in particular of CMOS memory matrices connected to the device according to the invention as shown in FIG. 1, in order to provide the interfacing between ECL input signals and CMOS-type memory units, for example.

The operating mode of the control circuits used to carry out the aforementioned functions of reducing the steady-state electric-power consumption will be described later in the description.

Thus, as furthermore shown in FIG. 1, it may be pointed out that the circuit 1 for generating a signal in phase with the input signal I comprises a current comparator circuit formed by an input branch, denoted by 11, and an amplification branch, denoted by 12, the two branches being connected in parallel between the CMOS level supply voltage VCC and a common point, denoted by 13. The input branch and the amplification branch are each formed by a current generator, denoted respectively by 110 and 120, and a voltage-adjustable resistance, respectively 111 and 121. The output of the current generator 110 of the input branch 11 is coupled to an input for controlling the current generator 120 of the amplification branch 12. Furthermore, the control input of the voltage-adjustable resistance 111 of the input branch 11 is connected to an input terminal which receives the input signal I, while the input for controlling the adjustable resistance 121 of the amplification branch 12 is connected to the CMOS level supply voltage VCC.

Finally, as shown in FIG. 1, the circuit 1 for generating the signal in phase with the input signal comprises an attenuated current source, denoted by 14, which is connected in cascade with the input branch and the amplification branch in parallel, that is to say between the common point 13 and the reference voltage VSS.

The circuit 1 for generating the signal in phase with the input signal makes it possible to deliver the in-phase voltage at the point of connection between the current generator 120 and the voltage-adjustable resistance 121 of the amplification branch 12, as will be described later in the description.

As furthermore shown in FIG. 1, the shaping inverter circuit 3 advantageously comprises a single-output voltage comparator, denoted by 30, receiving on its negative and positive comparison inputs respectively the inverted in-phase signal delivered by the inverter circuit 2 and the in-phase signal delivered by the circuit 1 for generating a signal in phase with the ECL level input signal. The single-output voltage comparator circuit 30 delivers a comparison signal with respect to the aforementioned in-phase signal and the aforementioned inverted in-phase signal.

The shaping inverter circuit 1 also comprises a shaping inverter module 31 proper receiving the comparison signal delivered by the single-output voltage comparator 30, the comparison signal being with respect to the in-phase signal and with respect to the inverted in-phase signal, and delivering the calibrated in-phase signal.

A more detailed description of the constituent elements of the device which is the subject of the present invention, in an embodiment in CMOS technology, will now be given in conjunction with FIG. 2a.

In the embodiment in question, it should be pointed out that, as per the conventional representation, the electrode of the MOS transistors which is assigned a dot represents the drain electrode of this MOS transistor.

As shown in the aforementioned FIG. 2a, it should be pointed out that the current generator 110 of the input branch 11 of the constituent current comparator circuit of the circuit 1 for generating a signal in phase with the input signal is formed by two PMOS transistors connected in parallel, bearing the reference TP18i and TP4O, is connected between the supply voltage VCC and the common point 11 which in fact constitutes a first test point a.

Likewise, it should be pointed out that the current generator circuit 120 of the amplification branch 12 consists of a PMOS transistor bearing the reference TP4ecl. The gate electrodes of the aforementioned PMOS transistors 120 are interconnected and linked to the point 11 constituting the test point a.

Furthermore, the voltage-adjustable resistance 111 of the input branch 11 consists of two NMOS transistors in parallel, bearing the reference TN8ecl, TN1ecl, these transistors thus being interconnected between the point constituting the test point a and the common point 13, constituting a second test point b. The gate electrodes of the NMOS transistors, TN8ecl and TN1ecl, are connected to an input terminal which receives the ECL input signal referenced I.

Likewise, it should be pointed out that the voltage-adjustable resistance 121 is formed by two NMOS transistors connected in parallel between the source electrode of the constituent PMOS transistor 120 of the current generator 120 and the aforementioned common point 13 constituting the second test point b. It should be pointed out that the common point formed by the drain electrodes of the two NMOS transistors bearing the reference TN17i and TN16i forming the voltage-adjustable resistance 121 constitutes a third test point c.

Furthermore, the attenuated current source 14 is formed by a first and a second NMOS transistor, referenced TN15i and TN12i, these being connected in parallel between the common point 13 constituting the test point b and the reference voltage VSS. The base electrodes of the two aforementioned NMOS transistors forming a current source are connected by their gate electrode to an attenuation control module delivering an attenuation control voltage to the gate electrode of the NMOS transistors TN15i and TN12i.

As shown in the same FIG. 2a, it should be pointed out that the attenuation control module comprises a current source formed by a first and a second PMOS transistor which are connected in parallel between the CMOS level supply voltage VCC and a first common point 141. The PMOS transistors are referenced TP8o, TP12o. The base electrode of the aforementioned first and second PMOS transistors is connected to the first common point 141, which delivers a substantially constant current.

The attenuation control module also comprises a resistance formed by a PMOS transistor and an NMOS transistor which are connected in parallel between a second common point 142 and the reference voltage VSS, the transistors bearing the reference TP3ecl, TN7ecl. The gate electrode of the transistor TN7ecl is connected to the supply voltage VCC and that of the transistor TP3ecl is connected to the reference voltage VSS.

Furthermore, a voltage generator circuit is formed by a first and a second NMOS transistor, these being referenced TN6i, TN9i and connected in parallel between the first common point 141 and the second common point 142. The gate electrode of the aforementioned first and second NMOS transistors is connected to a third common point, 143, which constitutes the test point i and to which is interconnected the gate electrode of the first and second NMOS transistors bearing the references TN15i and TN12i forming the current generator constituting the attenuated current source 14.

Furthermore, the voltage generator circuit comprises, on the one hand, a first and second PMOS transistor which are connected in parallel, bearing the reference TP1o, TP0o, between the CMOS level supply voltage VCC and the fourth common point 143. The gate electrode of the aforementioned PMOS transistors is connected to the gate electrode of the first and second PMOS transistors TP8o, TP12o, constituting the current source, and, on the other hand, an NMOS transistor, denoted by TN25i, connected between the fourth common point 143 constituting the test point i and the reference voltage VSS, the gate electrode of the NMOS transistor, TN25i, being connected to the third common point 143 and delivering the attenuation control voltage to the gate electrode of the transistors TN15i, TN12i.

With regard to the threshold inverter circuit 2, it should be pointed out that this may comprise, as shown in FIG. 2a, a first and a second PMOS transistor, referenced TP7i, TP1ecl, which are connected in parallel between the CMOS supply voltage VCC and a common point constituting a test point e. The gate electrodes of the aforementioned first and second PMOS transistors are connected onto the output of the circuit 1 for generating an in-phase signal and receive the latter signal.

An NMOS transistor, bearing the reference TN3ecl, is connected in cascade between the common point forming the test point e and the reference voltage VSS, the gate electrode of this transistor being connected onto the output of the circuit for generating the in-phase signal and receiving the latter. The threshold inverter circuit 1 thus delivers the inverted in-phase signal to the common point constituting the test point e.

With regard to the shaping inverter circuit 3, one embodiment, as shown in FIG. 2a, may include, in order to produce the single-output voltage comparator 30, an input stage formed by a PMOS transistor, bearing the reference TP11o, connected in cascade with an NMOS transistor, bearing the reference TN10i, the combination of these two transistors being mounted between the supply voltage VCC and the reference voltage VSS. The common point between source electrode and drain electrode of the aforementioned transistors constitutes a test point f which is connected to the gate electrode of the NMOS transistor TN10i. The base electrode of the PMOS transistor TP11o forming the input stage is connected to the test point c, that is to say to the output of the circuit 1 for generating the in-phase signal. Furthermore, the aforementioned input stage is followed by an output stage formed by a PMOS transistor, referenced TP13o, and an NMOS transistor, referenced TN11i, these transistors being connected in cascade between the supply voltage VCC and the reference voltage VSS. The common point between source and drain electrodes of the aforementioned transistors constitutes a test point g which forms the output terminal of the single-output voltage comparator.

With regard to the shaping inverter module proper, 31, this may, as shown in FIG. 2a, advantageously consist of a first and a second PMOS transistor which are connected in parallel, bearing the reference TP1ecl, TP2ecl, between the CMOS level supply voltage VCC and a common point constituting a test point h, and of an NMOS transistor, bearing the reference TN9ecl, connected between the common point forming the test point h and the reference voltage VSS. The gate electrodes of the PMOS transistors TP1ecl and TP2ecl and of the NMOS transistor TN9ecl are connected to the test point g, that is to say in fact onto the output of the single-output voltage comparator 30. The calibrated in-phase signal is thus delivered to the common point constituting the test point h.

Finally, with regard to the output amplifier circuit 4, this may be formed by an input stage consisting of a PMOS transistor TP21o connected in cascade with an NMOS transistor, denoted by TN5ecl, between the supply voltage VCC and the reference voltage VSS, and by an output stage formed by a PMOS transistor, bearing the reference TP3o, mounted in cascade between an NMOS transistor, TN4ecl, between the aforementioned supply and reference voltages. The common point between source and drain electrodes of the aforementioned transistors is connected to the common point of the transistors of the input stage in order to form an output terminal delivering the CMOS level output signal in phase with the input signal.

With regard to the control circuits used to reduce the steady-state electric-power consumption in standby mode, it should be pointed out that these control circuits are directly integrated into each constituent module of the device which is the subject of the invention as shown in FIG. 2a.

In particular, for the circuit 1 for generating an in-phase signal, this control circuit comprises two PMOS transistors, referenced TP26o, TP16o, connected in parallel, these two parallel transistors being furthermore connected in series with an NMOS transistor, denoted by TN13o, between the supply voltage VCC and the reference voltage VSS. The gate electrodes of these transistors are connected to an input terminal of a consumption reduction control signal, which control signal is denoted by E.

Furthermore, a control transistor is also provided, this transistor being of the NMOS type, denoted by TN11o, and mounted in parallel between the gate electrodes of the transistors TN15i and TN12i, which are constituents of the current generator of the attentuated current source 14, and the reference voltage VSS. The gate electrode of the transistor TN11o is connected to the terminal receiving the control signal E.

With regard to the circuit for controlling the reduction in steady-state electric-power consumption within the threshold inverter circuit 2, it should be pointed out that this consists of a PMOS-type transistor, bearing the reference tP5o, connected between the CMOS level supply voltage VCC and the test point c constituting the output of the circuit 1 for generating an in-phase signal. The gate electrode of the PMOS transistor tP5o is connected to the common point of the PMOS transistors TP26o and TP16o and of the NMOS transistor TN13o.

With regard to the shaping inverter circuit, it should be pointed out that the circuit for controlling the reduction in steady-state electric-power consumption is incorporated into the single-output voltage comparator 30 and consists of an NMOS transistor, denoted by TN14o, connected between the common point forming the test point f and the reference voltage VSS, the gate electrode of this transistor being connected to the terminal receiving the control signal E.

The operation of all the elements shown in FIG. 2a is as follows.

When, for example, the ECL input signal, denoted by I, rises from 3.2 V to 4.1 V, the gate voltage of the transistors TN8ecl and TN1ecl rises as a consequence. This reduces the resistance existing between the drain and source electrodes of these two transistors. Since the current generated by the constituent transistors TP18i and TP4o of the current generator 110 is substantially constant, the voltage at the test point a decreases and the drain-source current of the transistor TP4ecl constituting the current generator 120 consequently increases. Since the gate voltage of the transistors TN17i and TN16i forming the voltage-adjustable resistance 121 is constant and equal to VCC and since, because of the fact that the TP4ecl transistor current increases, the voltage at the test point b, which is the common point 13, is substantially fixed, the voltage at the test point c, which is the point of output of the signal delivered by the circuit 1 for generating the in-phase signal, consequently increases, this being all the more so the higher the resistance between the common point 13, which is the test point b, and the test point c. This resistance, which is adjustable, thus makes it possible to obtain a voltage gain and a modification of the switching point with respect to the ECL input signal, which is the signal I.

The attenuated current source 14 allows the currents coming from the input and amplification branches 11 and 12 to flow while at the same time limiting their values and preventing them from going out of balance.

With regard to an opposite variation in the ECL input signal, that is to say during a signal I transition from 4.1 V to 3.2 V, it is sufficient to repeat the above procedure, assuming that all of the common points or nodes change in the opposite direction to that described previously.

The attenuated current source 14 as shown in FIG. 2a operates in the following manner. The transistors TN15i and TN12i have their gate electrode connected to the test point i, that is to say to a voltage source whose output is none other than the gate electrode of the transistor TN215i. Since this gate is connected to the gate electrode of the transistors TN6i and TN9i, which are themselves connected via their drain electrode to the current source formed by the transistors TP8o and TP12o and in their source electrode to the resistance formed by the transistors TP3ecl and TN7ecl, a constant voltage is developed at the test point k, the test point j delivering a constant current to the terminals of the resistance composed of the transistors TP3ecl and TP7ecl, this voltage being constant because the gate electrodes of the latter two transistors are connected to the reference voltage VSS and to the CMOS level supply voltage VCC respectively. The voltage existing between the nodes i and k, this being the gate-source voltage of the aforementioned transistors, is constant because the current flowing through the transistors TN6i and TN9i is constant.

Consequently the voltage at the test point i, that is to say at the common point 143, is constant, the transistors TP0o and TP1o serving to convey a current through the transistor TN25i, this current being the reverse in terms of the variations of that flowing in the transistors TP8o and TP12o.

With regard to the threshold inverter circuit 2, this consists of an analog inverter circuit having identical positive and negative thresholds, the threshold value being centered on the switching point of the output signal of the current comparator. The inverter circuit 2, as shown in FIG. 2a, is formed by the transistors TP7i, TP1ecl and TN3ecl. The voltage applied to the test point c, that is to say onto the output of the circuit for generating an in-phase signal, is thus inverted and amplified, in terms of voltage, at the test point e. It should be noted that these two voltages are positioned with respect to the same switching point. Consequently the difference between these two voltages is either positive or negative depending on the ECL level input voltage I applied.

With regard to the shaping inverter circuit 3, it should be pointed out that the single-output voltage comparator 30 is used to compare the input voltage at the test point c present on the gate electrode of the transistor TP11o with the output voltage, delivered by the inverter circuit 2, at the test point e. The single-output voltage comparator 30 is formed by the transistors TP11o, TP13o, TN10i and TN11i. When the voltage at the test point c rises whereas the voltage at the test point e falls as a consequence, toward its lowest value, the output voltage of the single-output voltage comparator 30, that is to say at the test point g, rises and vice versa. It is therefore possible to further increase the voltage gain of the entire device according to the invention.

The shaping inverter circuit proper, 31, is used to convert the voltage variations at the test point g into CMOS level voltage variations at the test point h. The circuit 31 is formed by the transistors TP0ecl, TP2ecl and TN9ecl. The circuit 31 is a single CMOS inverter, the switching point of which is chosen to be equal to the average value of the voltage amplitude appearing at the test point g, which is the output point of the single-output voltage comparator 30.

Finally, the output amplifier circuit 4 is advantageously formed by a CMOS-type inverter which can be used to increase the output current upon switching of the shaping inverter circuit 3. The output amplifier circuit is formed by the transistors TP3o, TP21o, TN5ecl and TN4ecl. The input of the output amplifier 4 is formed by the test point h and the output terminal of the latter, delivering the CMOS level signal in phase with the input signal, is denoted by O. The output amplifier circuit allows rapid switching of the connection line connecting the latter to a connection matrix of a CMOS memory, for example, so as to control a memory cell of the aforementioned memory with sufficiently short rise and fall times. Consequently, the propagation time of the switching signals within the core of the matrix is a minimum.

With regard to the control signal for the reduction in steady-state electric-power consumption in standby mode, it should be pointed out that this signal E is used not only to cut the steady-state consumption of the four aforementioned modules, and therefore to stop them operating, but also to generate an output CMOS level O, so as to inhibit the steady-state electric-power consumption of the cell of the aforementioned memory matrix.

When the voltage of the control signal E is, for example, equal to 0 V, the device according to the invention operates normally, whereas for E=VCC for example, the circuit 1 for generating a signal in phase with the input signal no longer operates because the attenuated current source 14 is open-circuited, as shown symbolically in FIG. 1 and physically in FIG. 2a, the open-circuiting being performed by means of the transistor TN11o.

Furthermore, in the case of E=VCC, the voltage at the test point d, that is to say on the gate electrode of the transistor P5o, is at the reference voltage VSS, i.e. 0 V, and the aforementioned transistor is conducting, which has the effect of positioning the test point c and therefore the input of the inverter circuit 2 at the supply voltage VCC. Because of the inversion carried out by the inverter circuit 2, the voltage at the test point e is therefore equal to the reference voltage VSS.

With regard to the shaping inverter circuit 3, when the control voltage E is equal to VCC, the transistor TN14o is turned on, which has the effect of blocking the constituent stages of the single-output voltage comparator 30 as well as positioning the output of the latter, that is to say the test point g, at the value of the supply voltage VCC. Consequently and because of the inversion carried out by the inverter circuit proper, 31, the output of the latter, i.e. the test point h, is positioned at the value of the reference voltage VSS, and the output terminal O of the amplifier circuit and of the device according to the invention is then positioned at the supply voltage value VCC, which corresponds to the maximum high level in CMOS technology.

The waveforms obtained at the test points a to k in FIG. 2a for an ECL input signal I, a control signal E and an output signal O are shown in FIGS. 2b1, 2b3 and 2b4, the abscissa axis being graduated in ns and the ordinate axis in volts.

It should furthermore be pointed out that all the modules described above are then almost insensitive to minute variations in the width of the NMOS transistors used, this being an advantage when the device which is the subject of the present invention is especially dedicated to applications in which the operating conditions are extreme. In such a case, it is necessary in the aforementioned transistors to position transistor inhibit regions at the bird's beak structures, that is to say polysilicon gate regions going from thick oxide to thin oxide, of the NMOS transistors so as to avoid the drain-source current bypassing the N transistor externally. Introducing these transistor inhibit regions, also called vignettes, reduces the widths of the aforementioned NMOS transistors but, on account of the fact that the overall structure is equipped with modules which are self-aligning with regard to variation in the switching thresholds, the entire structure of the device according to the invention remains operational. Furthermore, the device, which is the subject of the invention, thus constructed, with all proportions maintained, retains the same propagation-time, rise-time and fall-time electrical properties during switching events.

A particular embodiment of the ECL level/CMOS level logic-signal interfacing device which is the subject of the present invention will now be given in connection with FIG. 3.

This embodiment relates to a specific application in which two ECL level signals, denoted by $I_1$ and $I_2$ in FIG. 3, have to be converted into a CMOS level signal, the conversion criteria operating either in differential mode or in common mode on these signals. It will be recalled that the differential mode designates the value of the difference between the peak-to-peak amplitude between the input signals $I_1$ and $I_2$ and that the common mode, on the other hand, designates the mean value of the two aforementioned peak-to-peak amplitudes. It should be pointed out that the differential mode is used when there is a given amplitude difference between the input signals $I_1$ and $I_2$, this amplitude difference being converted into a CMOS level logic signal by means of the use of the embodiment described in FIG. 3.

In the aforementioned figure, the operating units corresponding to those in FIG. 1 or 2a, for example, bear the same references, the letter P or N being added to these references depending on whether PMOS or NMOS technology is used to produce the corresponding parts of the device.

As will be seen in the aforementioned FIG. 3, in this embodiment the interfacing device which is the subject of the present invention is used to provide the interfacing for the two ECL level input signals $I_1$, $I_2$ in differential mode and in common mode, so as to convert these signals into a CMOS level signal.

The device comprises, in a general manner, a first interfacing stage, denoted by I in FIG. 3, and a second interfacing stage, denoted by II in this same figure.

Of course, the first and second interfacing stages I and II are supplied with a CMOS level supply voltage, the voltage VCC, relative to a reference voltage VSS, as described previously in the description.

In a general manner, it should be pointed out that the first interfacing stage I advantageously comprises modules similar to those which constitute the embodiment of the device which is the subject of the present invention as described in FIG. 1 and 2a [sic].

By similar modules is meant modules which perform the same function, even if these modules have a slightly different structure. In particular, it should be pointed out that the first interfacing stage I is preferably produced in PMOS technology.

It comprises, as shown in FIG. 3, a circuit, denoted by 1P, for generating a signal in phase with the ECL level input signals, a threshold inverter circuit 2P, a shaping inverter circuit 3P and an output amplifier circuit 4P, said circuits being connected in cascade. It should be pointed out that these circuits perform the same function as those described in connection with FIGS. 1 and 2a in relation to the creation of corresponding signals.

In particular, it should also be pointed out that in the embodiment shown in FIG. 3, the threshold inverter 2P and shaping inverter 3P circuits are grouped together into one and the same module, designated by 2P, 3P, in FIG. 3.

In a nonlimiting manner, it should be pointed out that the circuit for generating a signal in phase with the ECL level input signals, the circuit references 1P in FIG. 3, consists of MOS transistors denoted by tp3, tp4, tp0, tp1, tp2, tn1, tn0 and tn4.

The threshold inverter circuit and the shaping inverter circuit grouped together into one and the same module, bearing the references 2P and 3P in FIG. 3 consist of the MOS transistors bearing the reference tp5, tp6, tn5 and tn6.

The output amplifier circuit 4P consists of the MOS transistors tn17, tn18, tp17 and tp18. This output amplifier circuit furthermore includes a NOT-AND type function which is used to obtain a logic level 1 when the control signal E is in the zero state.

With regard to the second interfacing stage II, this is produced in NMOS technology.

It comprises a circuit, a circuit referenced 1N, for generating a signal in phase with the ECL level input signals, a threshold inverter circuit and a shaping inverter circuit, these circuits bearing the reference 2N and 3N respectively but being grouped together into one and the same module, denoted by 2N,3N in FIG. 3. The output of the shaping inverter circuit 2N,3N of the second interfacing stage II is connected to the input of the output amplifier circuit of the first interfacing stage 4P at the point denoted by Ob in FIG. 3.

Thus, the circuit for generating a signal in phase with the ECL level input signals $I_1$, $I_2$, bearing the reference 1N, consists of the transistors tn11, tn12, tn13, tn14, tn16, tp14, tp15, tp10 and tp11, and the threshold inverter and shaping inverter circuits 2N,3N consist of the transistors tn9, tn15, tp7 and tp12.

The control input E is used to control the transistors tp8 and tp7, then the transistors tp9 and tn9 which consist of single inverters so as to control the transistors tp13, tn10 and tn3, which make it possible to cut off the supply to the circuits 1N, 1P, 2N,3N as well as 2P,3P under conditions similar to those described previously in the description. In such a control situation, the control signal E is in the zero state.

On the other hand, when the control input signal E is in the 1 state, the operation of the whole device in differential mode is enabled.

The embodiment described in FIG. 3 has made it possible to implement a differential function which includes a common mode for ECL level input signals of between 0.8 V and 4.5 V, while the differential mode, there being a difference in amplitude between the two input signals $I_1$, $I_2$, was obtained for a difference value of between 100 mV to VCC. It may thus be understood that the differential mode makes it possible to convert any difference in peak-to-peak amplitude of the two input signals $I_1$, $I_2$, which lies between approximately 100 mV and the value of the supply voltage VCC when the mean level of these signals, designated by the common mode, is itself between 0.8 V and 4.5 V.

In the common-mode operating mode, this common mode has a fixed value of 3.65 V for a non-differential input mode of 0.9 V.

From the standpoint of the general operation of the first and second conversion stages I, II, it should be pointed out that when the common mode of the input signals $I_1$, $I_2$ has a low value, lying between 0.8 and 2 V, for example, the conversion stage I operates by means of its PMOS transistors. On the other hand, for a common mode above 2 V and up to 4.5 V, the conversion stage II takes over, by means of its NMOS transistors. Thus, the conversion stages I and II operate alternately depending on the value of the common mode, both stages not consuming any electric current when not operating.

Finally, it should be pointed out that the embodiment of the interfacing circuit which is the subject of the present invention, as shown in FIG. 3, may be used so as to perform analog interfacing for circuits such as microcontrollers so as to allow reception of digital data emanating from an environment encoding corresponding information, in voltage and current form of a varied nature. The useful information may then be found in the difference between the two input signals $I_1$ and $I_2$, for example.

Finally, it should be pointed out that a particularly advantageous application relates to the detection of a voltage level of an electric supply battery of a portable system, such as a portable computer, so as to warn the user that the supply system is deviating from its rated voltage value.

An ECL level/CMOS level logic-signal interfacing device has thus been described which is particularly high-performance insofar as this device allows communication between these two logic environments under extreme voltage, temperature and operating variation conditions, without in any way introducing a reference voltage, only small variations in the electrical behavior of the CMOS-type transistors used being introduced in the case where such devices are intended for applications in extreme operating conditions.

Over and above the simple character of the structure of the device and of its use, it should be pointed out that the device according to the invention also makes it possible to save space in terms of connections to be made, to be easy to use and to have a low output noise level because of the low strength value of the switching currents employed.

The aforementioned advantages are achieved at the price of completely acceptable constraints such as higher heat dissipation than in conventional devices, this heat dissipation being constant however, and an arrangement of transistors whose topological characteristics are more sophisticated than the conventional-type transistors.

I claim:

1. An ECL level/CMOS level logic-signal interfacing device comprising, connected in cascade and supplied with a CMOS level supply voltage relative to a reference voltage:

a circuit for generating an in-phase signal in phase relationship with an ECL level input signal, said in-phase signal having an amplitude greater than that of said ECL level input signal and a mean amplitude value greater than that of said ECL level input signal;

a threshold inverter circuit having a threshold substantially equal to the mean amplitude value of said in-phase signal, said threshold inverter circuit receiving, on an inverting input, said in-phase signal and delivering an inverted in-phase signal;

a shaping inverter circuit receiving said inverted in-phase signal and delivering a calibrated in-phase signal; and an output amplifier circuit receiving said calibrated in-phase signal and delivering an output signal, at the CMOS level, in phase relationship with said ECL level input signal.

2. The device of claim 1, wherein said circuit for generating said in-phase signal in phase relationship with said ECL input signal comprises:

a comparator circuit formed by an input branch and an amplification branch which are connected in parallel between said CMOS level supply voltage and a common point, said input branch and said amplification branch each being formed by a current generator and a voltage-adjustable resistance, an output of said current generator of said input branch being coupled to an input for controlling said current generator of said amplification branch, an input for controlling the voltage-adjustable resistance of said input branch being connected to an input terminal for the ECL level input signal and an input for controlling the adjustable resistance of said amplification branch being connected to said CMOS level supply voltage; and an attenuated current source, connected in cascade with said input branch and said amplification branch in parallel, between said common point and said reference voltage, said circuit for generating said in-phase signal delivering said in-phase signal at the point of connection between the current generator and the voltage-adjustable resistance of said amplification branch.

3. The device of claim 1, wherein said threshold inverter circuit comprises:

first and second PMOS transistors connected in parallel between said CMOS supply voltage and a common point, said first and second PMOS transistors having gate electrodes connected at the output of said circuit for generating an in-phase signal and receiving said in-phase signal; and an NMOS transistor connected in cascade between said common point and said reference voltage, said NMOS transistor having a gate electrode connected at the output of said circuit for generating an in-phase signal and receiving said in-phase signal, said threshold inverter circuit delivering said inverted in-phase signal at said common point.

4. The device of claim 1, wherein said shaping inverter circuit comprises:

a single-output voltage comparator receiving, on comparison inputs thereof, said inverted in-phase signal and said in-phase signal, respectively, and delivering a comparison signal resulting from comparing said in-phase signal with said inverted in-phase signal; and a shaping inverter module receiving said comparison signal resulting from comparing said in-phase signal with said inverted in-phase signal and delivering said calibrated in-phase signal.

5. The device of claim 1, wherein said input amplifier circuit comprises:

first and second PMOS transistors connected in parallel between said CMOS level supply voltage and a common point;

first and second NMOS transistors connected in parallel between said common point and said reference voltage, said first and second PMOS and NMOS transistors having gate electrodes connected to the output of said shaping inverter circuit and receiving said calibrated in-phase signal, respectively, said common point delivering said CMOS level output signal.

6. The device of claim 1, wherein said circuit for generating an in-phase signal, said threshold inverter circuit and said shaping circuit include a control circuit receiving a control signal for reducing the steady-state electric-power consumption in standby mode and for applying to the output of said amplifier circuit a CMOS level output signal providing inhibiting of the steady-state consumption of a downstream circuit connected to said output of said output amplifier circuit.

7. The device of claim 2, wherein said attenuated current source comprises:

first and second NMOS transistors connected in parallel between said common point and said reference voltage; and an attenuation control module delivering an attenuation control voltage to the gate electrode of said first and second NMOS transistors.

8. The device of claim 7, wherein said attenuation control module comprises:

a current source formed by first and second PMOS transistors connected in parallel between said PMOS level supply voltage and a first common point, the base electrodes of said first and second PMOS transistors being connected to said first common point, which delivers a constant current;

a resistance formed by a PMOS transistor and a NMOS transistor connected in parallel between second common point and said reference voltage and having gate electrodes connected, respectively, to said reference voltage and to said CMOS level supply voltage; and voltage generator circuit formed by first and second NMOS transistors which are connected in parallel between said first and second common points, the gate electrodes of said first and second NMOS transistors being connected to a third common point to which are connected the gate electrodes of the first and second NMOS transistors forming said attenuated current source, said voltage generator circuit further comprising a first and second PMOS transistors connected in parallel between the CMOS level supply voltage and a fourth common point, and having gate electrodes connected to the gate electrodes of said first and second PMOS transistors constituting said current source, said voltage generator further comprising a NMOS transistor connected between said fourth common point and said reference voltage and having a gate electrode connected to said third common point and delivering said attenuation control voltage.

9. An ECL level/CMOS level logic-signal interfacing device for providing transmission of two ECL level input signals in differential mode and in common mode, said device comprising first and second complemented interfacing stages supplied with a CMOS level supply voltage relative to a reference voltage, said first interfacing stage of said first and second complemented interfacing stages comprising, connected in cascade:

a first circuit for generating a first in-phase signal in phase relationship with one of said two ECL level input signals, said first in-phase signal having an amplitude greater that of said one of said two ECL level input signals and a mean amplitude value greater that of said ECL level input signal;

a first threshold inverter circuit having threshold substantially equal to the mean amplitude value of said first in-phase signal, said threshold inverter circuit receiving, on an inverting input, said first in-phase signal and delivering a first inverted in-phase signal delivering a first inverted in-phase signal;

first shaping inverter circuit receiving said first inverted in-phase signal and delivering a first calibrated in-phase signal; and a first output amplifier circuit receiving said first calibrated in-phase signal and delivering an output signal at the CMOS level, in phase relationship with said one of said two ECL level input signals; and said second interfacing stage comprising, connected in cascade:

a second circuit for generating a second in-phase signal in phase relationship with one of said two ECL level input signals, said second in-phase signal having an amplitude greater than that of said one of said two ECL level input signals and a mean amplitude value greater than that of said ECL level input signal;

a second threshold inverter circuit having threshold substantially equal to the mean amplitude value of said second in-phase signal, said second threshold inverter circuit receiving, on an inverting input, said second in-phase signal and delivering a second inverted in-phase signal; and a second shaping inverter circuit receiving said second inverted in-phase signal and delivering a second calibrated in-phase signal, an output of said second shaping inverter circuit of said second interfacing stage being connected to an input of said first output amplifier circuit of said first interfacing stage.

10. The device of claim 9, wherein said first interfacing stage comprises PMOS elements, and said second interfacing stage comprises NMOS elements.

* * * * *